United States Patent [19]

Loh et al.

[11] Patent Number: 4,465,986
[45] Date of Patent: Aug. 14, 1984

[54] MAGNETOSTATIC WAVE DEVICE

[75] Inventors: Koon W. Loh, Pittsburgh; Peter R. Emtage, Churchill Borough, both of Pa.

[73] Assignee: Westinghouse Electric Corp., Pittsburgh, Pa.

[21] Appl. No.: 443,728

[22] Filed: Nov. 22, 1982

[51] Int. Cl.³ .......................... H03H 9/30; H01P 9/00
[52] U.S. Cl. ...................................... 333/148; 310/26; 333/149; 364/823
[58] Field of Search ................................ 333/138–158, 333/161, 164, 193–196, 17 L, 24.1; 331/96, 167, 107 A, 154, 157; 310/26; 364/823; 365/48, 50, 157

[56] References Cited

U.S. PATENT DOCUMENTS

| | | | |
|---|---|---|---|
| 4,137,470 | 1/1979 | Désormiére et al. | 310/26 |
| 4,199,737 | 4/1980 | Patterson et al. | 333/154 |
| 4,209,759 | 6/1980 | Volluet | 364/823 |
| 4,283,692 | 8/1981 | Adam | 333/17 L |
| 4,314,214 | 2/1982 | Castera et al. | 333/141 |
| 4,318,061 | 3/1982 | Castera | 331/107 A |
| 4,395,686 | 7/1983 | Adam | 333/151 |

OTHER PUBLICATIONS

Seshadri–"Surface Magnetostatic Modes of a Ferrite Slab", Proceedings of the IEEE, Mar. 1970; pp. 506–507.

Castera et al.–"Adjustable Magnetostatic Surface-Wave Multistrip Directional Coupler", Electronics Letters, Feb. 28, 1980; pp. 195–196.

DiLorenzo et al.–"GaAs Power MESFET's: Design, Fabrication and Performance", IEEE Transactions on Microwave Theory and Techniques, vol. MTT-27, No. 5, May 1979; pp. 367–377.

Primary Examiner—Marvin L. Nussbaum
Attorney, Agent, or Firm—W. E. Zitelli

[57] ABSTRACT

A magnetostatic wave device which has broad application in the signal processing arena is disclosed herein. Basically, the magnetostatic wave device includes a layer of magnetized magnetic medium having a surface which includes a prespecified area to support the propagation of magnetostatic waves. A generator element is disposed at one end of the propagation area and is operative to carry an electromagnetic signal to generate magnetostatic waves supported by the propagation area. A pattern of conductive material having a plurality of conductive paths commonly coupled together at both ends is disposed in juxtaposition with the propagation area of the magnetic medium surface. In one embodiment, the conductive pattern includes a variable impedance coupled to each of a desired number of the conductive paths thereof to vary the impedance of the path. Each variable impedance is adjustable controlled in accordance with an applied governing signal. A receiver element is disposed at the other end of the propagation area and is operative to receive the propagated magnetostatic waves and render an output electromagnetic signal. More specifically, the pattern of conductive paths may include a planar array of a plurality of metallic strips disposed in juxtaposition with the propagation area of the magnetic medium surface and aligned in a substantially parallel array with spacings of no more than half a wavelength of the propagated magnetostatic wave apart. The parallel array alignment is transverse to the propagation path of the magnetostatic wave.

20 Claims, 18 Drawing Figures

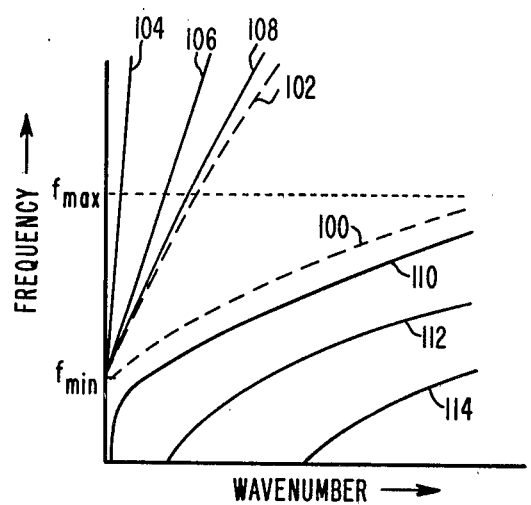
FIG. 6B
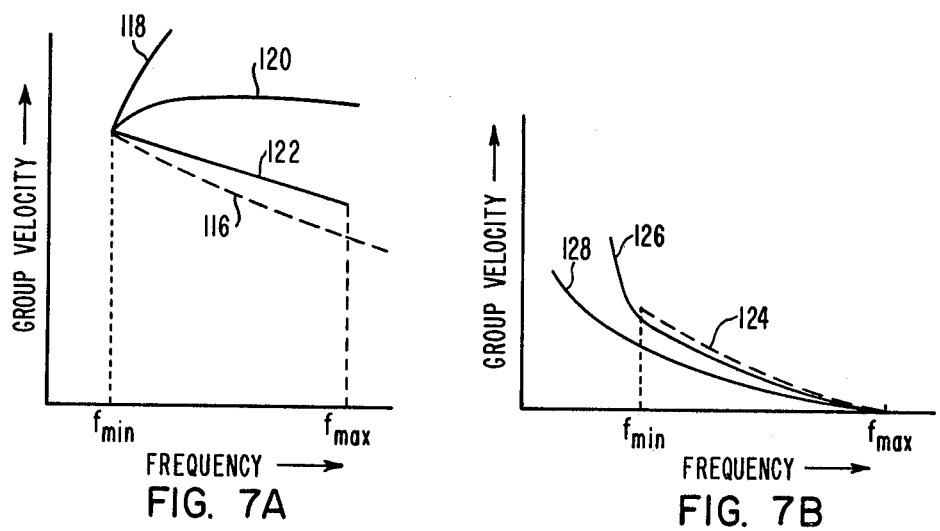
FIG. 7A
FIG. 7B
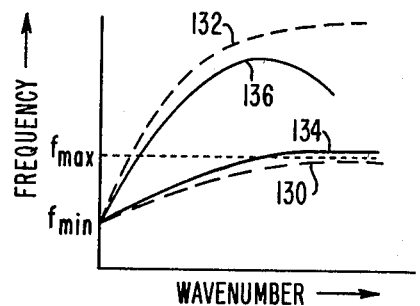
FIG. 8

MAGNETOSTATIC WAVE DEVICE

BACKGROUND OF THE INVENTION

The present invention relates to magnetostatic wave devices, in general, and more particularly to a magnetostatic wave device which includes a structure for causing a variation in the propagation velocity of the magnetostatic waves supported by the device.

In general, magnetostatic waves are supported by a magnetized medium which in most cases is a thin ferrite layer or slab under the effects of a magnetic field. The propagation of the magnetostatic waves supported by the magnetized medium is measured by its wave number or group velocity, or in reciprocal form, the group delay times. In one experimental arrangement, conductors were disposed at the ends of the magnetized ferrite slab, which was a single crystal of yttrium-iron-garnet (YIG) and an electromagnetic signal was conducted through the conductor at one end, commonly referred to as the generator, causing a magnetostatic wave to propagate across the YIG layer at a propagation velocity. Accordingly, an electromagnetic signal is induced in the conductor at the other end of the ferrite layer by the magnetostatic waves received thereby, this conductor being commonly referred to as the receiver. Thus, the group delay time of the magnetostatic waves may be measured as the time between generation and reception across the propagation path of the ferrite layer. For a more detailed understanding of the phenomenon of magnetostatic wave propagation as supported by a magnetized medium, reference is hereby made to an article in the *IEEE Proceedings*, 58, 506, (1970) authored by S. R. Seshadri. In the Seshadri experiments, it has been observed that when one surface of the magnetized medium is metalized, the propagation velocity of the magnetostatic waves is at least twice that of when the surface is free of metal, commonly referred to as a free surface.

In another set of experiments, referred to as the Castera/Hartemann experiments, magnetostatic surface waves were propagated in a thin YIG film grown on a <111> oriented gadolinium gallium garnet (GGG) substrate. A magnetic field was applied in the plane of the YIG film perpendicular to the direction of wave propagation. An array comprising a plurality of metallic strips was disposed on one surface of the film separated by less than one half a wavelength and aligned transverse to the direction of wave propagation. Generator and receiver elements were disposed at respective ends of the propagation path on the surface of the film. It was observed in these experiments that the propagation velocity of the magnetostatic surface waves influenced by the isolated metallic strips is close to the wave velocity on a free surface. However, when the metallic strips were electrically connected together at both ends thereof, the magnetostatic surface wave propagation velocity became close to that of waves propagating under the influence of a metalized surface. Exemplary observed dispersion relationships taken from the Castera/Hartemann experiments are shown in the graph of FIG. 1A. In FIG. 1A, the solid lines 20 and 22 represent the dispersion relations for metalized surface and free surface, respectively, as developed through the Seshadri experiments. The dashed lines 24 and 26 are representative of the dispersion relations for open strips and shorted strips as developed through the Castera/Hartemann experiments.

FIG. 1B depicts a graph illustrating the group velocity versus signal frequency relationships of magnetostatic surface waves between open and shorted metallic surface strips as estimated from the dispersion relationships shown in FIG. 1A. The solid lines 28 and 30 are representative of the estimated group velocities over the designated signal frequency range for the shorted and open metallic surface strips, respectively. For a more detailed understanding of these experimental results, reference is hereby made to an article in *Electronics Letters* 16, 195, (1980) authored by J. P. Castera and P. Hartemann.

SUMMARY OF THE INVENTION

In accordance with one aspect of the present invention, a magnetostatic wave device comprises a layer of magnetic medium having a surface which includes a prespecified area to support the propagation of magnetostatic waves. A first predetermined pattern of conductive material is disposed at one end of the prespecified area and is operative to carry a first electromagnetic signal which generates magnetostatic waves supported by the prespecified area of the magnetic medium at times when the magnetic medium is exposed to an appropriately aligned magnetic field. A second predetermined pattern of conductive material having a plurality of conducting paths commonly coupled together at both ends is disposed in juxtaposition with the propagation area of the magnetic medium surface. The second predetermined patern includes a means for altering the impedance of the conductive paths thereof in accordance with an applied governing signal to cause a variation in the propagation velocity of the magnetostatic waves generated by the electromagnetic signal of the first conductor. In addition, a third predetermined pattern of conductive material is disposed at the other end of the prespecified surface area and operative to receive the propagated magnetostatic waves and render a second electromagnetic signal conducted therethrough in response to the received magnetostatic waves.

More specifically, the altering means includes a variable impedance coupled to each of a desired number of the conductive paths of the second conductive material pattern to vary the impedance thereof. Each variable impedance is adjustably controlled in accordance with an applied governing signal. In one embodiment, the second predetermined pattern of conductive paths includes a planar array of a plurality of metallic strips disposed on the propagation area of the magnetic medium surface and aligned in a substantially parallel array with spacings of no more than half a wavelength of the propagated magnetostatic wave apart. The parallel array alignment is transverse to the propagation path of the magnetostatic waves supported by the magnetic medium and the ends of the metallic strips are conductively coupled together at each side of the propagation path. In another embodiment, a layer of insulating material is disposed over the surface of the magnetic medium and the planar array of metallic strips is disposed on the exposed surface of the insulating material layer and aligned to lie over the propagation area.

In another aspect of the present invention in which the magnetostatic wave device is utilized for the storage and retrieval of signals, a charge storage element is coupled in series with each of a desired number of the conductive paths of the second pattern. An electronic switch means is coupled in series with the corresponding charge storage element of each of the desired number of conductive paths. The switch means is operative to connect and disconnect the circuit of the conductive path associated therewith as governed by an electronic signal applied thereto.

In still another aspect of the present invention in which the magnetostatic wave device is utilized for the storage and correlation of signals, at least two charge storage elements are coupled in series with each of a desired number of the conductive paths of the second pattern and an electronic switch means is coupled in parallel with the corresponding one of the charge storage elements in each selected conductive path. The switch means is operative to render the one charge storage element ineffective as governed by an electronic signal applied thereto. Means are provided for measuring a potential across the commonly coupled ends of the plurality of conductive paths of the second pattern, whereby the potential at times is representative of the correlation of two signals.

In still another aspect of the present invention, a magnetostatic wave device is operative as a tunable resonator and includes first and second magnetostatic wave mirrors disposed at one end and another end of the propagation area, respectively, for reflecting therefrom back toward the propagation area magnetostatic waves supported by the magnetic medium. In this aspect, the first predetermined pattern of conductive material is disposed at the one end of the prespecified area and is operative to carry a first electromagnetic signal which generates the magnetostatic waves supported by the prespecified area.

In still another aspect of the present invention, a magnetostatic wave variable directional coupler device further includes third and fourth patterns of conductive material adjacently disposed at the other end of the propagation area, each correspondingly aligned transverse to a portion of the propagation path of the propagation area for receiving magnetostatic waves supported by the propagation area in accordance with the directional coupling thereof. The means for altering the impedance of the conductive path of the second pattern governs the directional coupling of the magnetostatic waves received by the third and fourth conductive paths.

BRIEF DESCRIPTION OF THE DRAWINGS

FIGS. 6A and 6B are graphs depicting various dispersion relationships of the capacitive impedances with regard to the embodiment depicted in FIG. 5.

FIGS. 7A and 7B are graphs depicting group velocity relationships for various capacitive impedances also with regard to the embodiment depicted in FIG. 5.

FIG. 8 is a graph depicting dispersion relationships when the capacitive impedance elements are replaced with inductive impedance elements with regard to the embodiment depicted in FIG. 5.

DESCRIPTION OF THE PREFERRED EMBODIMENT

Figure 2:
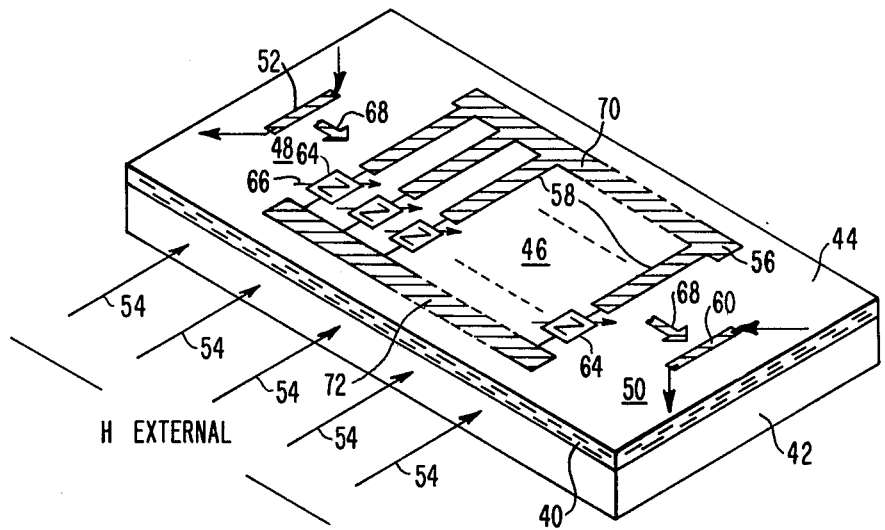
FIG. 2 is an isometric view illustration of a magnetostatic wave device suitable for embodying the broad principles of the present invention.

A magnetostatic wave device suitable for embodying the broad principles of the present invention is depicted in an isometric view in FIG. 2. Referring to FIG. 2, a layer of magnetic medium 40, preferably comprising yttrium-iron-garnet (YIG), may be disposed over a substrate 42, which may be comprised of gadolinium gallium garnet (GGG). The magnetic medium 40 has an exposed surface 44 which includes a prespecified area 46 to support the propagation of magnetostatic waves from one end 48 of said prespecified area 46 to another 50. A first predetermined pattern of conductive material 52 may be disposed on the surface 44 at the one end 48 of the prespecified area 46 and is operative to carry a first electromagnetic signal which generates magnetostatic waves supported by the prespecified area 46 of the magnetic medium 40 at times when the magnetic medium 40 is exposed to an appropriately aligned magnetic field H denoted by the arrowed lines 54. A second predetermined pattern of conductive material 56 having a plurality of conductive paths 58 commonly coupled together at both ends may be disposed in juxtaposition with the propagation area 46 of the magnetic medium surface 44. A third predetermined pattern of conductive material 60 may be disposed at the other end 50 of the prespecified surface area 46 and is operative to receive the propagated magnetostatic waves and render a second electromagnetic signal conducted therethrough in response to the received magnetostatic waves.

While the external magnetic field H is shown in the example of FIG. 2 as being aligned parallel to the surface of the magnetic medium 40, it is understood that other alignment orientations of the H field may be contemplated without deviation from the present invention. For example, another orientation of the H field may be perpendicular to the surface of the magnetic medium 40 to yield forward volume magnetostatic waves which may facilitate applications of the device endemic to this type of wave formation.

In accordance with the present invention, means are included for altering the impedance of the conductive paths 58 of the second pattern 56 in accordance with an applied governing signal to cause a variation in the propagation velocity of the magnetostatic waves generated by the electromagnetic signal of the first conductor 52. More specifically, the altering means includes a variable impedance 64 coupled to each of a desired number of the conductive paths 58 to vary the impedance thereof. Each variable impedance 64 may be adjustably controlled in accordance with an applied governing signal 66. More specifically, in the particular embodiment depicted in FIG. 2, the second predetermined pattern of conductive paths 58 includes a planar array of a plurality of metallic strips disposed on the propagation area 46 of the magnetic medium surface 44 and aligned in a substantially parallel array with spacings of no more than half a wavelength of the propagated magnetostatic wave apart. The parallel array alignment is transverse to the propagation path 68 of the magnetostatic waves supported by the magnetic medium 40. The ends of the metallic strips 58 are conductively coupled together on each side of the propagation paths as shown at 70 and 72.

Figure 3:
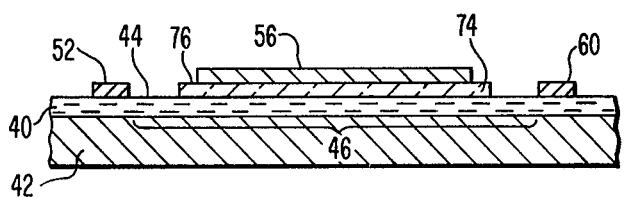
FIG. 3 is a cross-sectional schematic illustration of an alternate embodiment of a magnetostatic wave device.

In an alternate embodiment as shown by the cross-sectional schematic of FIG. 3, a layer of insulating material 74, which may be a dielectric, for example, may be disposed over the exposed surface 44 of the magnetic medium 40. The second predetermined pattern of conductive paths 56 may be disposed on the exposed surface 76 of the insulating material 74 lying over the propagation area 46. In this embodiment, the second conductive material pattern 56 is separated from the magnetic medium 40 by the thickness of the insulating layer 74. One reason for the separation is to adjust the coupling of the current in the conductive paths of the pattern 56 induced by the magnetostatic waves supported by the magnetic medium 40. At times, this coupling is stronger than what is desired. Under these circumstances, decreasing the coupling to a more desirable level is accomplished by positioning the conductive pattern 56 a distance away from the magnetic material utilizing the thickness of the insulating layer 74. And, of course, the coupling may be varied in accordance with the thickness of the insulating material 74 (i.e. the distance the conductive pattern 56 is disposed away from the magnetic medium 40).

Figure 4:
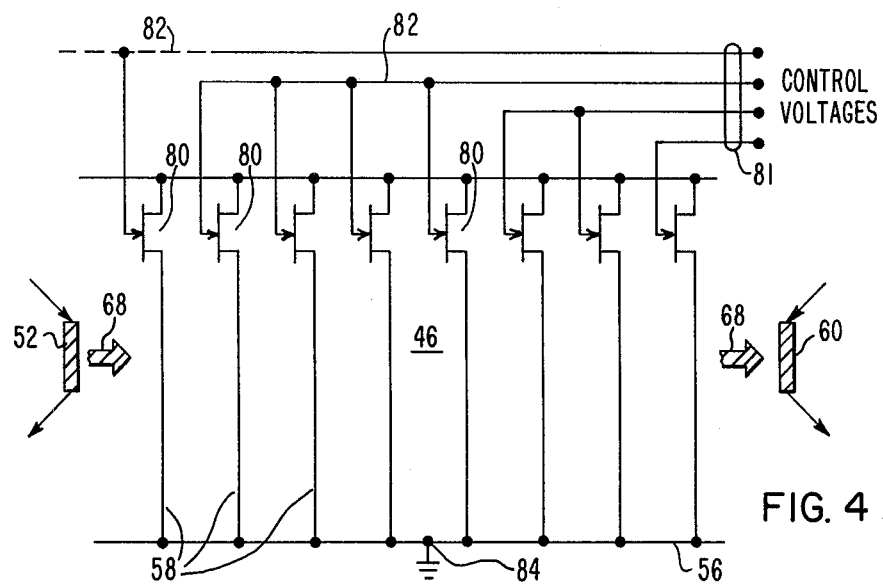
FIG. 4 is a schematic illustration of a plan view of one embodiment of the surface of a magnetostatic wave device which is suitable for use in the embodiment of FIG. 2.

In one embodiment, the altering means 64 includes an electronic switch means coupled in series with each of a desired number of the conductive paths 58 of the second conductive material pattern 56. Each electronic switch means is operative to connect and disconnect the circuit of the conductive path associated therewith as governed by an electronic signal applied thereto. FIG. 4 depicts in a circuit schematic illustration (plan view of FIG. 2) of the electronic switch means as a field effect transistor 80 in the selected paths 58 operatively controlled in a short circuit and an open circuit state by a voltage signal 81 applied to the gate regions thereof. The switches 80 may be controlled simultaneously as shown at 81 or in groups like that depicted by the signal lines 82. It is understood that in the operation of the field effect transistor 80, the control voltages over signal lines 81 or 82 should be referenced to a reference level. It is for this reason, in this embodiment, that one of the commonly connected portions 84 of the ends of the path pattern 56 be connected to a reference potential level, like ground level, for example.

Figure 1A:
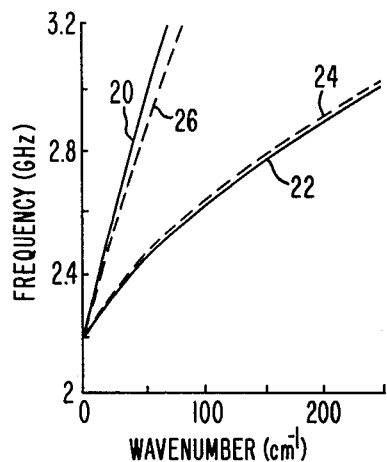
FIGS. 1A and 1B are graphs which depict observed dispersion relationships and associated group velocities of magnetostatic waves.
Figure 1B:
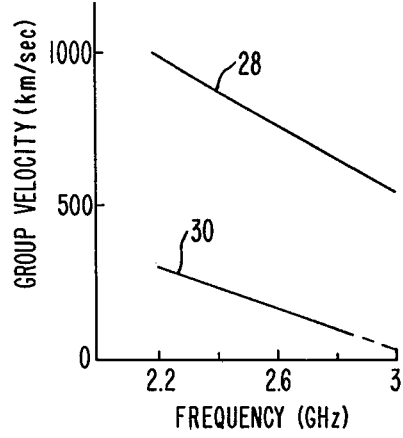

In a typical operation then, when the switches 80 short circuit the paths 58, the conductive pattern 56 influences the group velocity of the magnetostatic waves propagating along the propagation path 68 very closely to that of a metalized surface. Conversely, when the switches 80 are open circuit, the conductive paths of the pattern 56 influence the group velocity of the magnetostatic waves propagating along the path 68 much the same as a free surface. Referring to FIG. 1B, as the switches 80 are opened and closed the group velocity of the magnetostatic waves along the propagation path 68 will be altered between the solid line 30 and the solid line 28, the characteristics of which result in a substantially fixed difference therebetween over an operating electromagnetic signal frequency range, which for the YIG type of magnetic material may be on the order of 1 gigahertz or so. Because of the operational frequency of the field effect transistors 80 which may be of the gallium-arsenide type, for example, which respond well for frequencies up to 20 gigahertz, the bandwidth and variation of the group velocity of the magnetostatic waves is limited by the bandwidth of the magnetostatic waves themselves.

Figure 5:
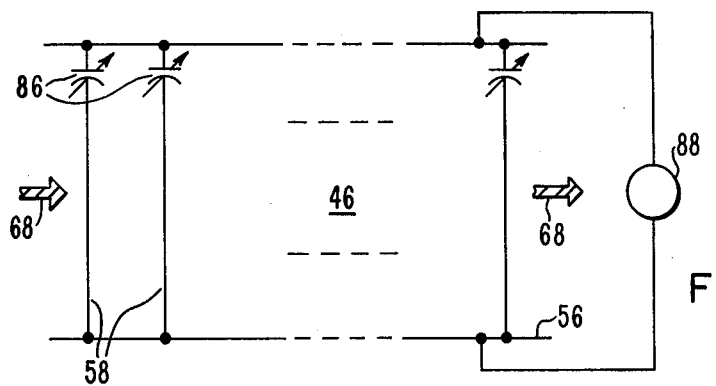
FIG. 5 is a schematic illustration of a plan view of another embodiment of the surface of a magnetostatic wave device suitable for use in the embodiment of FIG. 2.

In an alternate embodiment, the altering means may include a variable impedance coupled to each of a desired number of the conductive paths 58 of the second conductive pattern 56 to vary the impedance thereof. Each variable impedance may be adjustably controlled in accordance with an applied governing signal. FIG. 5 illustrates schematically (plan view of FIG. 2) the embodiment including variable impedances wherein each variable impedance is a variable capacitive element 86, like a varactor, for example. The varactors 86 may be coupled in series with each selected path and adjustably controlled in accordance with a voltage signal 88 applied thereto. In the example shown in FIG. 5, the voltage signal 88 is applied across the commonly coupled ends of the conductive paths 58.

Figure 6A:
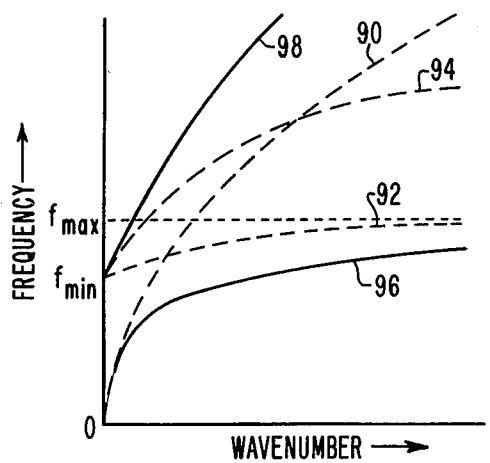

Dispersion relations for a capacitive impedance of a fixed value are exemplified by the graph of FIG. 6A. The embodiment of conductive paths joining two lines through a capacitance (i.e. series connection) resembles an electromagnetic "slow wave" characteristic; the "slow wave" is characterized by the dashed line 90 of FIG. 6A. In operation, the dispersion relations are dominated by the interaction between the electromagnetic wave through the capacitive element 86 and the magnetostatic waves propagating along the path 68. The result is that the magnetostatic wave becomes broken into two branches which both lie outside the region between the free (line 92) and metalized (line 94) wave characteristics. These branches are denoted by the solid lines 96 and 98 and are referred to as the "slow" and "fast" branches, respectively.

The effect on the magnetostatic waves induced by a variable capacitance is depicted in the graph of FIG. 6B. Here again, the free surface and metalized surface magnetostatic wave characteristics are depicted by the dashed lines 100 and 102, respectively. The solid lines 104, 106 and 108 depict the dispersion relationships for capacitances of low, medium and high relative values with respect to each other having characteristics above the metalized surface characteristics. Similarly, the solid lines 110, 112 and 114 depict the dispersion relationships for capacitances of low, medium and high values relative to each other below the free surface characteristics. Note that at high capacitances, the "fast" branch approaches the dispersion relation of the metalized surface (i.e. line 108 is very close to line 102). While at low capacitances, the "slow" branch approaches that of the free surface as expected (i.e. line 110 is very close to line 100).

The dependence of magnetostatic wave group velocity on the electromagnetic signal frequency for "fast" and "slow" capacitive branches is illustrated in the graphs of FIGS. 7A and 7B. The characteristics of the "fast" capacitive branches are exhibited in FIG. 7A referenced to the characteristics of the metalized surface as shown by the dashed line 116. In FIG. 7A, the solid lines 118, 120 and 122 represent the magnetostatic wave group velocity for capacitances of low, medium and high values, respectively. Similarly, the group velocity characteristics for the "slow" branches are exhibited in FIG. 7B. The free surface characteristics are provided by the dashed line 124, while the solid lines 126 and 128 characterize the slow branch relationships for low and medium capacitive values, respectively. Noteworthy is the existence of a region of almost constant group velocity in one of the "fast" branches of FIG. 7A, more specifically that shown by the solid line 120. In perusal of the graphs of FIGS. 7A and 7B, it should be kept in mind that the prime interest is in waves that are predominantly magnetostatic in nature, i.e., the "fast" branch with relatively large capacitance like that shown by the solid line curve 122, for example, or the "slow" branch with relatively small capacitance like that shown by the solid line 126, for example.

It is understood that inductive elements may also be used for the variable impedances without deviating from the proposed invention. The graph of FIG. 8 depicts exemplified calculated dispersion relationships with the impedances of large and small inductances. Referring to FIG. 8, the dashed lines 130 and 132 are representative of the dispersion relationships for a free surface and a metalized surface, respectively. With the inductance having a finite value, the dispersion relationships influenced by the inductances lie between those for the free and metalized surfaces. Accordingly, with a high value of inductance as depicted by the solid line 134, the dispersion characteristics approach that of the free surface 130. Conversely, with low inductance values as depicted by the solid line 136, the dispersion characteristics approach that of the metalized surface 132.

It is further understood that the variable impedances may also be a variable resistive element coupled in series with each selected conductive path 58. An embodiment including variable resistive elements may be similar to one including field effect transistors coupled in series with each of the selected conductive paths as depicted in FIG. 4. However, in the variable resistive element case, the field effect transistors may be operated within the linear region thereof, for example, by the signals applied to the gate regions thereof to effect a variable resistance in each of the conductive paths 58. It is preferred that the field effect transistors be of the gallium arsenide type which are operative to frequencies up to 20 gigahertz. When the impedance is embodied as a resistive element rather than a capacitive element, the magnetostatic waves have only a single velocity branch. Accordingly, attenuation results from the resistive losses in the resistive element in series with the selective conductive paths, and when the resistive element is high the attenuation is inversely proportional to the resistance at a fixed frequency. For a more detailed description of the application of field effect transistors as applied in the present example, more particularly those of the gallium arsenide type, reference is hereby made to an article of the *IEEE Transactions on Microwave Theory and Techniques* entitled "GaAs Power MESFET's: Design, Fabrication, and Performance", authored by DiLorenzo and Wisseman, Vol. MTT-27, No. 5, May 1979, p. 367.

One application for the magnetostatic wave device described hereabove is as a microwave delay line in which the variation in delay may be large and be electronically controlled. The proposed application makes use of the fact that the magnetostatic waves travel at least twice as fast on a metalized surface as on a free surface (see FIG. 1B); and wherein variable impedances coupled to conductive or metalized paths alter the "effective" metalization or conduction of the surface. Subnanosecond changes in delay by a factor of two appear feasible. Applications may extend to phased array radars and radar signal processing.

Figure 9A:
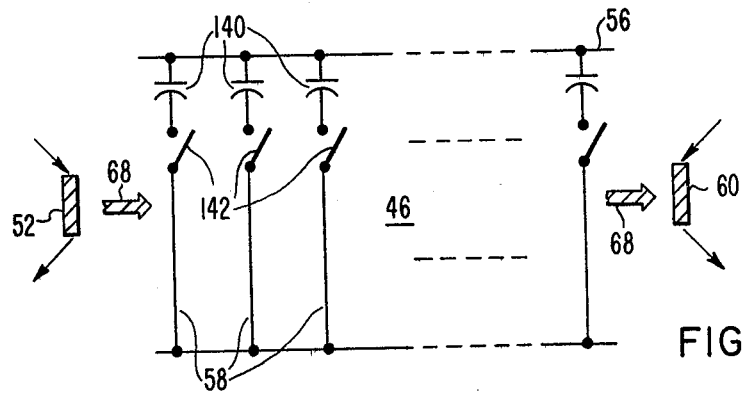
FIG. 9A is a circuit schematic illustration of a plan view of still another embodiment of the surface of a magnetostatic wave device suitable for use in the embodiment of FIG. 2.

An embodiment of another aspect of the present invention is schematically illustrated (plan view of FIG. 2) in FIG. 9A. This embodiment relates to a magnetostatic wave device for the storage and retrieval of signal information. In this example, a charge storage element 140 may be disposed in each of a desired number of the conductive paths 58 of the second conductive pattern 56 and coupled in series therewith. An electonic switch means 142 may also be disposed in each of the desired number of conductive paths 58 and coupled in series with the corresponding charge storage element 140 in each case. The switch means is operative to connect and disconnect the circuit of the conductive paths 58 associated therewith as governed by an electronic signal applied thereto (not shown). The generator 52 and receiver 60 are shown to illustrate the propagation path 68 of the magnetostatic wave in relation to the second pattern of the conductive material 56.

Figure 9B:
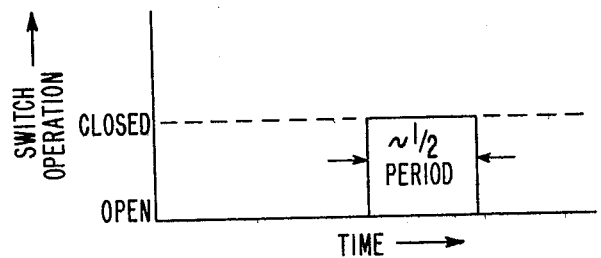
FIG. 9B is a graph representative of the operation of the embodiment depicted in FIG. 9A.

In the embodiment of FIG. 9A, the charge storage elements include a capacitor in series with the conductive branch 58. In addition, the electronic switch means may be embodied to include a field effect transistor operatively controlled in a short circuit and an open circuit state by a voltage signal applied to the gate region thereof much the same as that shown in the schematic diagram of FIG. 4. In operation, while the electronic switches 142 are open, the group velocity of a magnetostatic wave is that of the wave on a free surface as described hereabove. Upon closing the switches 142 to obtain a short circuit in the conductive paths 58, charge flows into the capacitors 140 if a magnetostatic wave pulse is supported by the magnetic medium disposed under the conductive paths 58. The aforementioned charge may be stored if the switches 142 are then opened after an appropriate interval which is exemplified in the time graph of FIG. 9B. An optimum interval for switch closure or storage time is estimated as approximately ½-period of the magnetostatic traveling wave, during which time approximately 50% of the traveling wave energy may be representatively stored in the capacitors 140.

The original signal represented by the stored charge may be regenerated by first closing and then opening the electronic switches 142 again. A magnetostatic wave is thus generated and propagated through to the receiver 60 to render an electromagnetic signal representative thereof. The estimated loss is on the order of 8 dB's. The time-bandwidth limitations of the magnetostatic pulse may be considered as those of magnetostatic waves on a free surface without reduction by metalization, because no current flows in the metal conductors 58 except during the short circuit periods of storage and regeneration rendered by the operation of the electronic switches 142.

Figure 10:
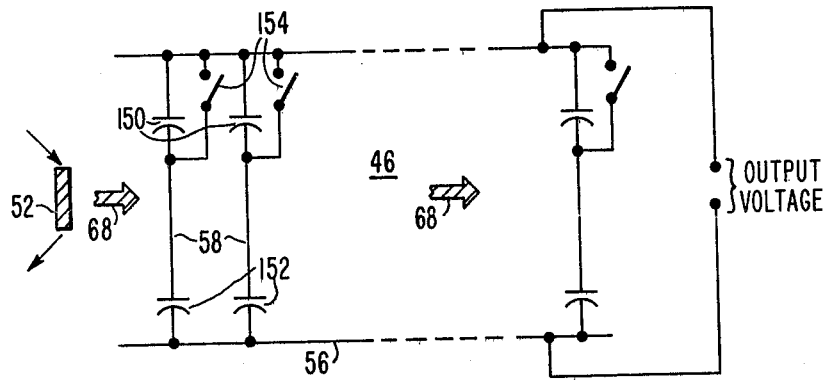
FIG. 10 is a schematic illustration of a plan view of still another embodiment of the surface of a magnetostatic wave device suitable for use in the embodiment of FIG. 2.

In another aspect of the present invention, the embodiment which is schematically illustrated (plan view of FIG. 2) in FIG. 10 includes at least two charge storage elements 150 and 152 disposed in each of a desired number of the conductive paths 58 of the second pattern 56 and coupled in series therewith. The potential across the charge storage elements 150 and 152 may be adjustably controlled in accordance with the charge stored therein. Preferably, each of the charge storage elements 150 and 152 include a varactor. An electronic switch 154 may be coupled in parallel with a corresponding one of the charge storage elements 150 in each of the selective conductive paths 58. The electronic switch 154 in each case operates to render the one charge storage element 150 ineffective as governed by an electronic signal applied thereto (not shown). The electronic switches 154 may be of the field effect transistor variety much as described hereabove in connection with the embodiment of FIG. 4. With an appropriate choice of the capacitive elements 150 and 152, approximately 25% of the power of these magnetostatic waves propagated along the path 68 may be stored in the capacitors 150 without undue loss. Upon closure of the electronic switches 154 for a short time, the charge on these capacitors 150 may be shorted out, while the charge on the capacitors 152 of the conductive paths 58 remain. After the magnetostatic wave signal pulse has propagated through the device, a representative charge thereof remains stored on the capacitive elements 152.

In a correlator, the capacitive elements must be non-linear such as that produced by the varactor elements 150 and 152 in the embodiment of FIG. 10. When a signal enters the correlator from the generator 52, the output voltage as measured across the commonly coupled ends of the second conductive pattern 56 depends upon the interaction between the stored charge $q_s$ and the input charge $q_i$, that is:

$$V = (1/C)_{x_o} \, ^{x_f}(q_s+q_i)dx + (C'/C^2)_{x_o} \, ^{x_f}(q_s+q_i)^2 dx, \quad (1)$$

where C is the capacitance, $C^1$ the non-linear capacitance, and the integral is taken along the length $(x_o - x_f)$ of the correlator (i.e. propagation paths). If the wave-velocity v is constant, $$q_i = q_i(x/v - t), \quad (2)$$

then the cross-product term in the second integral becomes $$V^1 = 2v(C'/C^2) \int q_s(t')q_i(t'-t)dt'. \quad (3)$$

That is, it is the correlation of the stored and input signals. A much larger proportion of the power of the magnetostatic traveling wave may be used in the magnetostatic device depicted by the embodiment of FIG. 10 than in a comparable piezoelectric device, but the time-bandwidth limitations on the magnetostatic wave pulse are restricted by losses due to the metalization.

Figure 11:
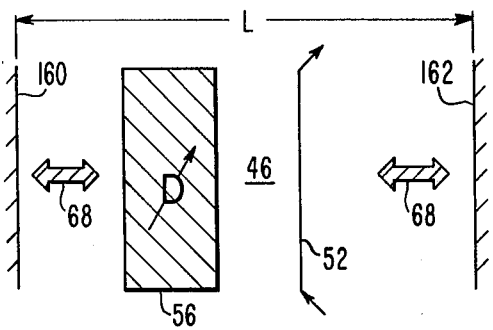
FIG. 11 is a schematic illustration of a plan view of still another embodiment of the surface of a magnetostatic wave device suitable for use in the embodiment of FIG. 2.

In still another aspect of the present invention, an embodiment for a tunable resonator magnetostatic wave device is schematically illustrated in FIG. 11. The schematic of FIG. 11 is a plan view of a magnetostatic device similar in structural composition as that described in connection with the embodiment of FIG. 2. The second predetermined pattern of conductive material which includes a plurality of conductive paths commonly coupled at both ends as shown by the block 56. Included therein is a means for altering the impedance of the conductive paths in order to cause a variation in the propagation velocity of the magnetostatic waves along the propagation path 68. The altering means may be similar to any one of those described hereabove in connection with the various embodiments shown. A first magnetostatic wave mirror 160, which may be of a conventional configuration, may be disposed at one end of the propagation area 46, and a second conventional magnetostatic wave mirror 162 may be disposed at the other end thereof. The mirrors 160 and 162 are positioned in their respective ends for reflecting therefrom back toward the propagation area 46 in each case magnetostatic waves supported by the magnetic medium. The length L of the resonator may be the distance between the mirrors 160 and 162. In this embodiment, the generator 52 is disposed at the one end of the propagation area 46 between the second pattern 56 and magnetostatic mirror 162.

In operation, the altering means of the conductive paths of the second pattern 56 alters the impedance thereof in accordance with an applied governing signal to cause a variation in the propagation velocity of the magnetostatic waves supported by the propagation area 46 of the magnetic medium. This magnetostatic device is rendered tunable by the variable delay governed by the change in conductivity of the paths of the second pattern 56. The resonance conditions may be mathematically expressed as $$2kL + 2\Delta\phi = 2\pi n \quad (4)$$

where n is an integer and L is the length of the resonator. The resonant frequencies f may be expressed mathematically as $$f = f_m + v/2L(n - \Delta\phi/\pi), \quad (5)$$

where $f_m$ is the least magnetostatic wave frequency and v the wave velocity.

The resonant line width may be considered small when L is made very large, but the frequency separation remains small; the main resonator as described in connection with the embodiment of FIG. 11 may then be coupled to a subsidiary resonator of smaller length and greater bandwidth (not shown in FIG. 11) to suppress unwanted resonances. Understandably, the subsidiary resonator should also be tunable. Note that only small changes in $\Delta\phi$ are needed in the main resonator; a delay line can therefore be made short, and losses will have little effect.

Figure 12:
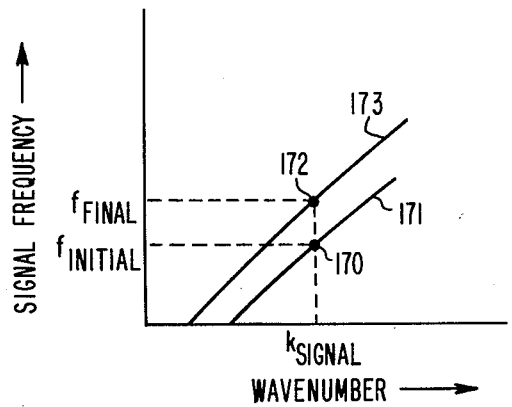
FIG. 12 is a graph illustrating the operation of the magnetostatic wave embodiment of FIG. 5 when utilized as a frequency changer.

In another example of application, the frequency of a magnetostatic wave pulse traversing the propagation path of the second pattern of conductance material may be altered by a change in the capacitive impedances, which alters the phase velocity. For this application, an embodiment similar to that described in connection with FIG. 5 may be found suitable. The wave number of the magnetostatic wave may be unaltered because the magnetic displacements under the conductive path are the same before and after a quick change in the capacitance of the element 86. The signal frequency therefore becomes the frequency corresponding to the wave number of the magnetostatic wave for the revised capacitance. This is shown graphically in FIG. 12. Assuming that the wave number k of the magnetostatic wave device remains fixed through the quick changing capacitance from a point 170 on the solid line representing the characteristics of an initial capacitance value to a point 172 on the solid line 173 representing the characteristics of a final capacitance value, the change in signal frequency is shown on the ordinant of the graph. Changes in signal frequency of approximately 10% to 15% appear feasible with this arrangement. Similar effects have been described in the ferrite type of magnetic medium as a result of changing the bias magnetic fields thereof, however electronic control has not before, to the knowledge of the applicants, been described.

Figure 13A:
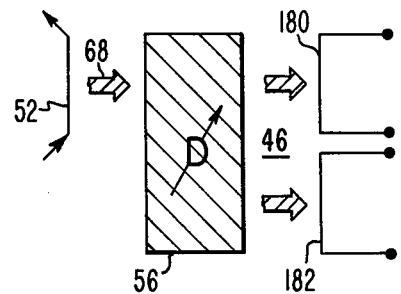
FIG. 13A is a schematic illustration of a plan view of still another embodiment of the surface of a magnetostatic wave device suitable for use in the embodiment of FIG. 2.
Figure 13B:
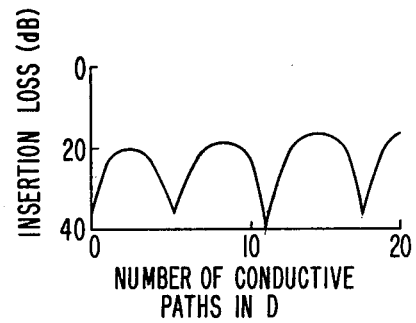
FIG. 13B is a graph which illustrates the insertion loss with respect to the operation of the embodiment depicted in FIG. 13A.

In still another aspect of the present invention, a magnetostatic wave variable directional coupler is depicted in a suitable embodiment schematically illustrated in FIG. 13. FIG. 13 depicts a plan view of a magnetostatic device similar in structural composition to that described in connection with the embodiment of FIG. 2. The area 56 represents the variable group velocity governing mechanism of the magnetostatic waves along the propagation path thereof as described supra. More particularly, in this embodiment third and fourth patterns of conductive material 180 and 182, respectively, are adjacently disposed at the other end of the propagation area from that of the generator 52. Each pattern 180 and 182 may be correspondingly aligned transverse to a portion of the propagation path of the propagation area 46 for receiving the magnetostatic waves supported by the propagation area 46 in accordance with the directional coupling imposed by the conductive pattern 56. The altering means included in the conductive pattern 56 for altering the conductivity of the conductive paths of the pattern governs the directional coupling of the magnetostatic waves received by the third and fourth conductive patterns 180 and 182, respectively. The electromagnetic signals induced in the conductors 180 and 182 are thus representative of the directional coupling imposed by the altering of the conductivity of the paths in 56. The electromagnetic signal output induced in the conductor 182 may be represented mathematically as $$P_B = P_o \sin^2[\tfrac{1}{2}(k_f - k_z)L] \quad (6)$$

where $k_f$ is the free wave number, $k_z$ is the wave number characteristic of the variable impedance of the conductive paths of 56 (see FIG. 2), and L is the length of the propagation path. In the aforementioned reference of Castera/Hartemann, the observed output may be sketched for the case in which the impedance equals zero or $k_z$ equals $k_m$. The sketch is shown in FIG. 13B. It is evident from the above equation, that variation in $k_z$, through variations in the impedances of the conductive paths, will alter the frequency at which peak transfer from conductor 180 to conductor 182 is obtained. The length of the propagation path may be small in the present application, so attenuation under the conductive pattern 56 should not be considered important.

We claim:
1. A magnetostatic wave device comprising:
a layer of magnetic medium having a surface which includes a prespecified area to support the propagation of magnetostatic waves from one end of said prespecified area to another;
a first predetermined pattern of conductive material disposed at said one end of said prespecified area and operative to carry a first electromagnetic signal which generates magnetostatic waves supported by the prespecified area of said magnetic medium at times when said magnetic medium is exposed to an appropriately aligned magnetic field;
a second predetermined pattern of conductive material having a plurality of conductive paths commonly coupled together at both ends, said second pattern of conductive material disposed in juxtaposition with said propagation area of said magnetic medium surface;
means for altering the impedance of said conductive paths of said second pattern in accordance with an applied governing signal to cause a variation in the propagation velocity of said magnetostatic waves generated by said electromagnetic signal of said first conductor; and
a third predetermined pattern of conductive material disposed at said another end of said prespecified surface area and operative to receive said propagated magnetostatic waves and render a second electromagnetic signal conducted therethrough in response to said received magnetostatic waves.

2. The magnetostatic wave device in accordance with claim 1 wherein the altering means includes a variable impedance coupled to each of a desired number of the conductive paths of the second conductive material pattern to vary the impedance thereof, each variable impedance adjustably controlled in accordance with an applied governing signal.

3. The magnetostatic wave device in accordance with claim 2 wherein each variable impedance includes a variable capacitive element.

4. The magnetostatic wave device in accordance with claim 3 wherein each variable capacitive element is a varactor coupled in series with each selected path and adjustably controlled in accordance with a voltage signal applied thereto.

5. The magnetostatic wave device in accordance with claim 2 wherein each variable impedance includes a variable resistive element coupled in series with each selected path.

6. The magnetostatic wave device in accordance with claim 5 wherein each variable resistive element includes a field effect transistor which is adjustably controlled in accordance with a voltage signal applied to the gate region thereof.

7. The magnetostatic wave device in accordance with claim 1 wherein the altering means includes an electronic switch means coupled in series with each of a desired number of the conductive paths of the second conductive material pattern and operative to connect and disconnect the circuit of the conductive path associated therewith as governed by an electronic signal applied thereto.

8. The magnetostatic wave device in accordance with claim 7 wherein each electronic switch means includes a field effect transistor operatively controlled in a short circuit and an open circuit state by a voltage signal applied to the gate region thereof.

9. The magnetostatic wave device in accordance with claim 1 wherein the second predetermined pattern of conductive paths includes a planar array of a plurality of metallic strips disposed on the propagation area of the magnetic medium surface and aligned in a substantially parallel array with spacings of no more than half a wavelength of the propagated magnetostatic wave apart, said parallel array alignment being transverse to the propagation path of the magnetostatic waves supported by the magnetic medium, the ends of the metallic strips being conductively coupled together on each side of the propagation path.

10. The magnetostatic wave device in accordance with claim 1 including a layer of insulating material disposed over the surface of the magnetic medium; and wherein the second predetermined pattern of conductive paths includes a planar array of a plurality of metallic strips disposed on the exposed surface of said insulating material layer lying over the propagation area and aligned in a substantially parallel array with spacings of no more than half a wavelength of the propagated magnetostatic wave apart, said parallel array alignment being transverse to the propagation path of the magnetostatic waves supported by the magnetic medium, the ends of the metallic strips being conductively coupled together on each side of the propagation path.

11. The magnetostatic wave device in accordance with claim 1 wherein the magnetic medium includes yttrium-iron-garnet (YIG).

12. A magnetostatic wave device for the storage and retrieval of signals, said device comprising:
  a layer of magnetic medium having a surface which includes a prespecified area to support the propagation of magnetostatic waves from one end of said prespecified area to another;
  a first predetermined pattern of conductive material disposed at said one end of said prespecified area and operative to carry a first electromagnetic signal which generates magnetostatic waves supported by the prespecified area of said magnetic medium at times when said magnetic medium is exposed to an appropriately aligned magnetic field;
  a second predetermined pattern of conductive material having a plurality of conductive paths commonly coupled together at both ends, said second pattern of conductive material disposed in juxtaposition with said propagation area of said magnetic medium surface;
  a charge storage element for each of a desired number of said conductive paths of said second pattern and coupled in series therewith;
  an electronic switch means for each of said desired number of conductive paths and coupled in series with said corresponding charge storage element, said switch means operative to connect and disconnect the circuit of the conductive path associated therewith as governed by an electronic signal applied thereto; and
  a third predetermined pattern of conductive material disposed at said another end of said prespecified surface area and operative to receive said propagated magnetostatic waves and render a second electromagnetic signal conducted therethrough in response to said received magnetostatic waves.

13. The magnetostatic wave device in accordance with claim 12 wherein the charge storage element includes a capacitor.

14. The magnetostatic wave device in accordance with claim 12 wherein the electronic switch means includes a field effect transistor operatively controlled in a short circuit and an open circuit state by a voltage signal applied to the gate region thereof.

15. The magnetostatic wave device in accordance with claim 12 wherein the second predetermined pattern of conductive paths includes a planar array of a plurality of metallic strips in juxtaposition with the propagation area of the magnetic medium surface and aligned in a substantially parallel array with spacings of no more than half a wavelength of the propagated magnetostatic wave apart, said parallel array alignment being transverse to the propagation path of the magnetostatic waves supported by the magnetic medium, the ends of the metallic strips being conductively coupled together on each side of the propagation path.

16. A magnetostatic wave device for the storage and correlation of signals, said device comprising:
  a layer of magnetic medium having a surface which includes a prespecified area to support the propagation of magnetostatic waves from one end of said prespecified area to another;
  a first predetermined pattern of conductive material disposed at said one end of said prespecified area and operative to carry a first electromagnetic signal which generates magnetostatic waves supported by the prespecified area of said magnetic medium at times when said magnetic medium is exposed to an appropriately aligned magnetic field;
  a second predetermined pattern of conductive material having a plurality of conductive paths commonly coupled together at both ends, said second pattern of conductive material disposed in juxtaposition with said propagation area of said magnetic medium surface;
  at least two charge storage elements for each of a desired number of said conductive paths of said second pattern and coupled in series therewith;
  an electronic switch means for each selected conductive path and coupled in parallel with the corresponding one of said charge storage elements thereof, said switch means operative to render said one charge storage element ineffective as governed by an electronic signal applied thereto; and
  means provided for measuring a potential across the commonly coupled ends of said plurality of conductive paths of said second pattern, whereby said potential at times is representative of the correlation of two signals.

17. The magnetostatic device in accordance with claim 16 wherein each charge storage element includes a varactor.

18. The magnetostatic wave device in accordance with claim 16 wherein the second predetermined pattern of conductive paths includes a planar array of a plurality of metallic strips in juxtaposition with the propagation area of the magnetic medium surface and aligned in a substantially parallel array with spacings of no more than half a wavelength of the propagated magnetostatic wave apart, said parallel array alignment being transverse to the propagation path of the magnetostatic waves supported by the magnetic medium, the ends of the metallic stris being conductively coupled together on each side of the propagation path.

19. A magnetostatic wave device operative as a tunable resonator comprising:
  a layer of magnetic medium having a surface which includes a prespecified area to support the propagation of magnetostatic waves from one end of said prespecified area to another;

first and second magnetostatic wave mirrors disposed at said one end and said other end of said propagation area, respectively, for reflecting therefrom back toward said propagation area magnetostatic waves supported by said magnetic medium;

a first predetermined pattern of conductive material disposed at said one end of said prespecified area and operative to carry a first electromagnetic signal which generates magnetostatic waves supported by the prespecified area of said magnetic medium at times when said magnetic medium is exposed to an appropriately aligned magnetic field;

a second predetermined pattern of conductive material having a plurality of conductive paths commonly coupled together at both ends, said second pattern of conductive material disposed in juxtaposition with said propagation area of said magnetic medium surface; and means for altering the impedance of said conductive paths of said second pattern in accordance with an applied governing signal to cause a variation in the propagation velocity of said magnetostatic waves supported by said propagation area of said magnetic medium.

20. A magnetostatic wave variable directional coupler device comprising:

a layer of magnetic medium having a surface which includes a prespecified area to support the propagation of magnetostatic waves from one end of said prespecified area to another;

a first predetermined pattern of conductive material disposed at said one end of said prespecified area and operative to carry a first electromagnetic signal which generates magnetostatic waves supported by the prespecified area of said magnetic medium at times when said magnetic medium is exposed to an appropriately aligned magnetic field;

a second predetermined pattern of conductive material having a plurality of conductive paths commonly coupled together at both ends, said second pattern of conductive material disposed in juxtaposition with said propagation area of said magnetic medium surface;

third and fourth patterns of conductive material adjacently disposed at said other end of said propagation area, each correspondingly aligned transverse to a portion of the propagation path of said propagation area for receiving magnetostatic waves supported by said propagation area in accordance with the directional coupling thereof; and means for altering the impedance of said conductive paths of said second pattern to govern the directional coupling of the magnetostatic waves received by said third and fourth conductive patterns.

* * * * *